(12) United States Patent
Choi et al.

(10) Patent No.: US 8,344,614 B2
(45) Date of Patent: Jan. 1, 2013

(54) ORGANIC LIGHT EMITTING DISPLAY DEVICE AND METHOD OF MANUFACTURING THE SAME

(75) Inventors: Young-Seo Choi, Yongin (KR); Seung-Yong Song, Yongin (KR); Oh-June Kwon, Yongin (KR); Ji-Hun Ryu, Yongin (KR); Young-Cheol Joo, Yongin (KR); Sun-Young Jung, Yongin (KR); Kwan-Hee Lee, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 12/662,277

(22) Filed: Apr. 8, 2010

(65) Prior Publication Data
US 2011/0037382 A1 Feb. 17, 2011

(30) Foreign Application Priority Data
Aug. 14, 2009 (KR) .................. 10-2009-0075331

(51) Int. Cl.
*H01J 1/62* (2006.01)
*H01J 63/04* (2006.01)
(52) U.S. Cl. ..................... 313/504; 313/512
(58) Field of Classification Search .............. 313/504, 313/512
See application file for complete search history.

(56) References Cited

U.S. PATENT DOCUMENTS

| 5,864,206 A * | 1/1999 | Ishihara et al. ............. 313/506 |
| 2004/0245541 A1 | 12/2004 | Shitagaki et al. |
| 2005/0285520 A1 * | 12/2005 | Cok ............................. 313/512 |
| 2007/0194304 A1 | 8/2007 | Zu et al. |
| 2009/0065049 A1 * | 3/2009 | Son et al. ..................... 136/256 |
| 2009/0195147 A1 | 8/2009 | Song et al. |

FOREIGN PATENT DOCUMENTS

| KR | 10 2005-0088220 A | 9/2005 |
| KR | 10-2007-0078502 A | 8/2007 |
| KR | 10 2007-0083154 A | 8/2007 |
| KR | 10-2009-0084528 | 5/2009 |

* cited by examiner

*Primary Examiner* — Karabi Guharay
*Assistant Examiner* — Michael Santonocito
(74) *Attorney, Agent, or Firm* — Lee & Morse, P.C.

(57) ABSTRACT

An organic light emitting display (OLED) device and a method of manufacturing the same, the OLED device including a first substrate having an organic emission unit on a surface thereof, a second substrate above the first substrate, an inorganic sealing member between the first substrate and the second substrate, the inorganic sealing member bonding the first substrate and the second substrate. and a filler, the filler filling a space between the first substrate and the second substrate, wherein a volume of the filler is greater than a volume of a space between the first substrate, the second substrate, and the inorganic sealing member prior to bonding the first substrate and the second substrate.

14 Claims, 4 Drawing Sheets

ORGANIC LIGHT EMITTING DISPLAY DEVICE AND METHOD OF MANUFACTURING THE SAME

BACKGROUND

1. Field

Embodiments relate to an organic light emitting display device and a method of manufacturing the same.

2. Description of the Related Art

Flat panel display (FPD) devices may include devices using inorganic materials and devices using organic materials. Examples of devices using inorganic materials may include plasma display panels (PDP), which use photo luminescence from phosphors, and field emission display (FED) devices, which use cathode luminescence (CE). Examples of devices using organic materials may include liquid crystal display (LCD) devices and organic electroluminescent elements.

An organic electroluminescent element may include a pixel electrode and a counter electrode facing the pixel electrode. The organic electroluminescent element may also include a light emitting layer interposed between the pixel electrode and the counter electrode. Since the organic electroluminescent element may be easily damaged by, e.g., moisture or oxygen from the outside, the organic electroluminescent element may be sealed to prevent exposure to external impurities.

An organic light emitting display (OLED) device using the organic electroluminescent element may exhibit a shorter response time than widely commercialized LCD devices. Furthermore, since OLED devices are self-luminescent, i.e., do not require a backlight, OLED devices may exhibit wide viewing angles and high brightness. Thus, OLED devices are considered as a next-generation display apparatus.

SUMMARY

Embodiments are directed to an organic light emitting display device and a method of manufacturing the same, which represent advances over the related art.

It is a feature of an embodiment to provide an organic light emitting display (OLED) device with improved bending strength and improved shock-resistance.

At least one of the above and other features and advantages may be realized by providing an organic light emitting display (OLED) device including a first substrate having an organic emission unit on a surface thereof, a second substrate above the first substrate, an inorganic sealing member between the first substrate and the second substrate, the inorganic sealing member bonding the first substrate and the second substrate, and a filler, the filler filling a space between the first substrate and the second substrate, wherein a volume of the filler is greater than a volume of a space between the first substrate, the second substrate, and the inorganic sealing member prior to bonding the first substrate and the second substrate.

The inorganic sealing member may be formed of frit.

The inorganic sealing member may be disposed at outer portions of the first substrate and the second substrate.

A thickness of a center portion of the OLED device may be greater than thicknesses of outer portions of the OLED device.

The filler may have a viscosity of about 1000 cps or greater.

An amount of the filler between center portions of the first substrate and the second substrate may be greater than an amount between outer portions of the first substrate and the second substrate.

A thickness of the center portion of the OLED device may be greater than thicknesses of outer portions of the OLED device.

At least one of the above and other features and advantages may also be realized by providing a method of manufacturing an organic light emitting display (OLED) apparatus with a first substrate having an organic emission unit on a surface thereof and a second substrate above the first substrate including forming the organic emission unit on the surface of the first substrate, forming an inorganic sealing member on the second substrate, disposing a filler on a portion of the second substrate, and bonding the first substrate and the second substrate such that a thickness of a center portion of the OLED device is greater than thicknesses of outer portions of the OLED device.

The inorganic sealing member may be formed of frit.

The inorganic sealing member may be disposed at outer portions of the second substrate such that the inorganic sealing member surrounds the organic emission unit of the bonded first substrate and second substrate.

The step of disposing the filler on a portion of the second substrate may be carried out such that the filler is disposed on a portion of the second substrate apart from the inorganic sealing member during manufacturing.

The filler may be disposed on a center portion of the second substrate.

The bonding the first substrate and the second substrate may include arranging the first substrate and the second substrate such that the organic emission unit on the first substrate faces the filler on the second substrate, arranging the first substrate and the second substrate on each other such that a portion of the filler flows from the center portion toward outer portions of the OLED device, and irradiating a laser on the inorganic sealing member to effect bonding of the first substrate and the second substrate.

The filler may have a viscosity of about 1000 cps or greater.

The bonding the first substrate and the second substrate may be carried out in a vacuum.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
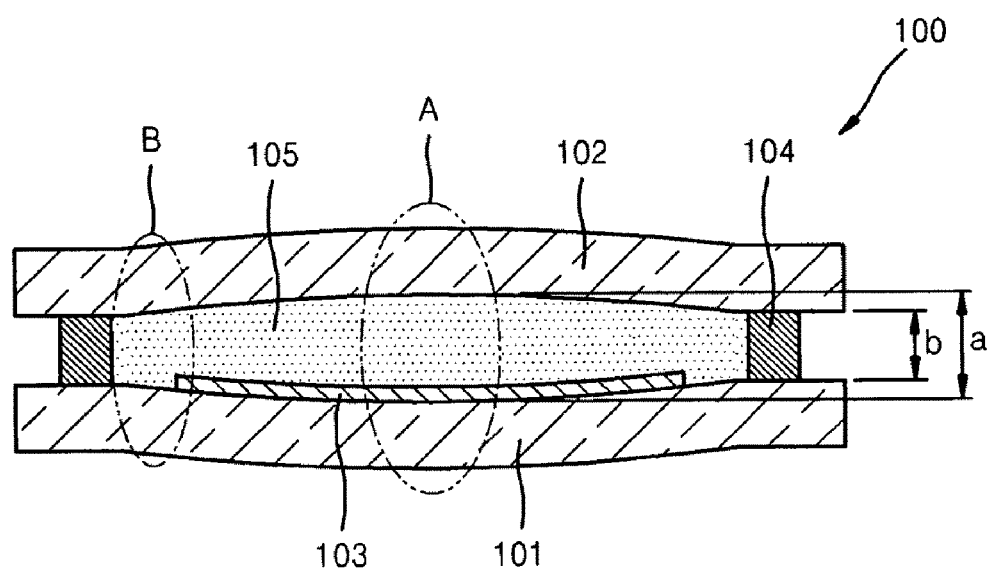
FIG. 1 illustrates a sectional view of an organic light emitting display (OLED) device according to an embodiment.

Korean Patent Application No. 10-2009-0075331, filed on Aug. 14, 2009, in the Korean Intellectual Property Office, and entitled: "Organic Light Emitting Display Device and Method of Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a sectional view of an organic light emitting display (OLED) device 100 according to an embodiment. Referring to FIG. 1, the OLED device 100 may include a first substrate 101, a second substrate 102, an organic emission unit 103, an inorganic sealing member 104, and a filler 105.

The first substrate 101 may be formed of, e.g., transparent glass, plastic sheet, and/or silicon. The substrate 101 may be either flexible or inflexible and either transparent or opaque. A metal plate may also be used as the first substrate 101. When the OLED device 100 is an active matrix (AM) OLED device, the first substrate 101 may include a thin-film transistor (TFT) (not illustrated).

The second substrate 102 may be disposed above the organic emission unit 103. As shown in FIG. 1, the second substrate 102 may be spaced apart from the organic emission unit 103 and may be connected to the first substrate 101 by interposing the inorganic sealing member 104 therebetween. The second substrate 102 may not only be formed of glass, but may also be formed of various plastic materials, e.g. acryl. When the OLED device 100 is a front-emission type OLED device, the second substrate 102 may be formed of an insulating material having high transmissivity with respect to light generated by the organic emission unit 103. The insulating material having high transmissivity with respect to light generated by the organic emission unit 103 may include, e.g., transparent glass materials, such as alkali glass and non-alkali glass, quartz, transparent ceramic materials, such as polyethylene terephthalate, polycarbonate, polyether sulfone, polyvinyl fluoride (PVF), polyacrylate, and zirconia.

At least one of the first substrate 101 and the second substrate 102 may be outwardly deformable in order to increase a volume of a space therebetween to accommodate the of filler 105. In particular, a center portion of at least one of the first substrate 101 and second substrate 102 may be outwardly deformable. In an implementation, both the first substrate 101 and the second substrate 102 may be outwardly deformable.

The organic emission unit 103 may include a plurality of organic light emitting devices. Each of the plurality of organic light emitting devices may include a pixel electrode, a counter electrode facing the pixel electrode, and an intermediate layer interposed between the pixel electrode and the counter electrode. The intermediate layer may include at least one light emitting layer.

The pixel electrode may be a transparent electrode or a reflective electrode. When the pixel electrode is a transparent electrode, the pixel electrode may be formed of, e.g., indium tin oxide (ITO), indium zinc oxide (IZO), zinc oxide (ZnO), and/or indium oxide ($In_2O_3$). When the pixel electrode is a reflective electrode, the pixel electrode may include a reflective film of, e.g., silver (Ag), magnesium (Mg), aluminum (Al), platinum (Pt), palladium (Pd), gold (Au), nickel (Ni), neodymium (Nd), iridium (Ir), chromium (Cr), and compounds thereof. In addition, a film may be formed on the reflective film, the film including, e.g., ITO, IZO, ZnO, or $In_2O_3$.

The counter electrode may also be a transparent electrode or a reflective electrode. When the counter electrode is a transparent electrode, the counter electrode may include a film of, e.g., Li, Ca, LiF/Ca, LiF/Al, Al, Mg, and compounds thereof. In addition, the counter electrode may include an assistant electrode or a bus electrode line on the film, the assistant electrode or a bus electrode including a material for forming a transparent electrode, e.g., ITO, IZO, ZnO, or $In_2O_3$. When the counter electrode is a reflective layer, the counter electrode may be formed of, e.g., Li, Ca, LiF/Ca, LiF/Al, Al, Mg, and compounds thereof.

The intermediate layer between the pixel electrode and the counter electrode may be formed of, e.g., a low molecular weight organic material or a high molecular weight organic material. When the intermediate layer includes a low molecular weight organic material, the intermediate layer may be formed by, e.g., stacking a hole injection layer (HIL), a hole transport layer (HTL), an organic emission layer (EML), an electron transport layer (ETL), and an electron injection layer (EIL) in a single or multi-layer structure. In the intermediate layer, various organic and organometallic raw materials may be used, including, e.g., copper phthalocyanine (CuPc), N,N-di(naphthalene-1-yl)-N,N'-diphenyl-benzidine (NPB), and tris(8-hydroxyquinoline) aluminum (Alq3). The low molecular organic materials may be formed by, e.g., vacuum deposition using masks.

When the intermediate layer includes a high molecular weight organic material, the intermediate layer may generally have a structure including a HTL and an EML. The HTL may be formed of, e.g., poly(3,4-ethylenedioxythiophene) (PEDOT) and the EML may be formed of a high molecular weight organic material, e.g., a poly-phenylenevinylene (PPV)-based material and/or a polyfluorene-based material.

The inorganic sealing member 104 may bond the first substrate 101 and the second substrate 102. The inorganic sealing member 104 may be disposed between the first substrate 101 and the second substrate 102 at outer portions thereof. The inorganic sealing member 104 may surround the organic emission unit 103. The inorganic sealing member 104 may include, e.g., frit. Although the term frit generally refers to powdered glass, the term frit as used herein may also refer to glass gel, which may be formed by adding organic material to powdered glass, and solid glass, which may be hardened by irradiating a laser onto powdered glass.

The filler 105 may fill spaces defined by the first substrate 101, the second substrate 102, and the inorganic sealing member 104. The filler 105 may be formed of, e.g., silicon containing fillers. The filler 105 may have a viscosity of about 1000 cps or greater. Because the filler 105 may fill the spaces defined by the first substrate 101, the second substrate 102, and the inorganic sealing member 104, the organic emission unit 103 may be protected from external shock. In other words, the filler 105 may prevent transmission of external shock to the organic emission unit 103 by absorbing the shock.

A volume of the filler 105 included in the OLED device 100 may be greater than a volume of the space defined by the first substrate 101, the second substrate 102, and the inorganic sealing member 104. In other words, the space defined by the first substrate 101, the second substrate 102, and the inorganic sealing member 104 may be filled with the filler 105 having a volume greater than the volume of the space. Because at least one of the first substrate 101 and the second substrate 102 may be outwardly deformable, the size of the space therebetween may increase to accommodate the volume of the filler 105. In particular, the center portion of at least one of the first substrate 101 and the second substrate 102 may deform outward to accommodate the volume of the filler 105. Since the filler 105 may be located on a center portion of the second substrate 102, when the first substrate 101 and the second substrate 102 are bonded to each other, a portion of the filler 105 may move toward outer portions of the second substrate 102, that is, toward the inorganic sealing member 104. Since the filler 105 may have a high viscosity, the amount of the filler 105 at the center of the OLED device 100 may be greater than that at the outer portions of the OLED device 100. Thus, a thickness of the center portion of the OLED device 100 may be greater than a thickness of the outer portions of the OLED device 100. Accordingly, since the filler 105 may be applied thicker at the center portion of the OLED device 100 than at the outer portions of the OLED device 100, the center portion of the OLED device may be protected from external shocks. If the OLED device 100 is dropped or bent, the shock may be mostly transmitted to the center portion of the OLED device 100.

Figure 2:
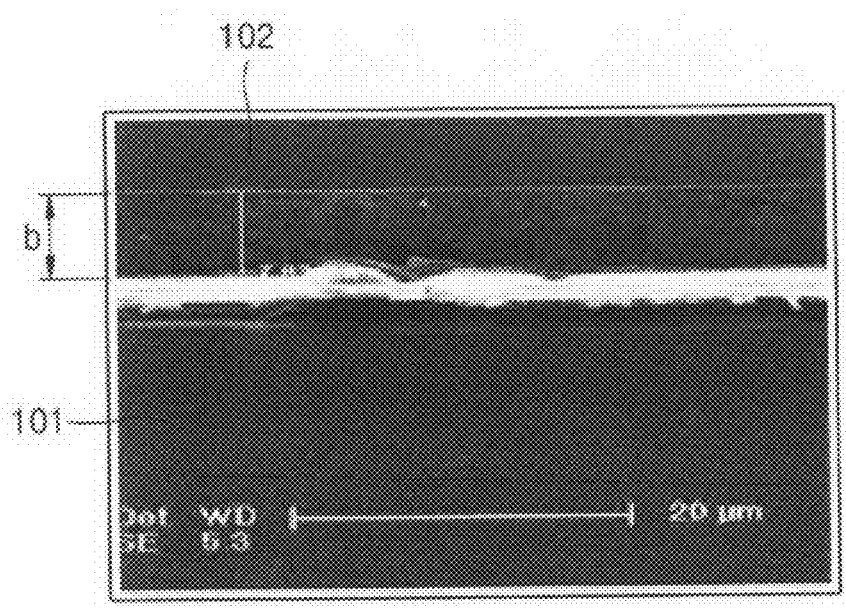
FIGS. 2 and 3 illustrate images of sections of an OLED device according to an embodiment.
Figure 3:
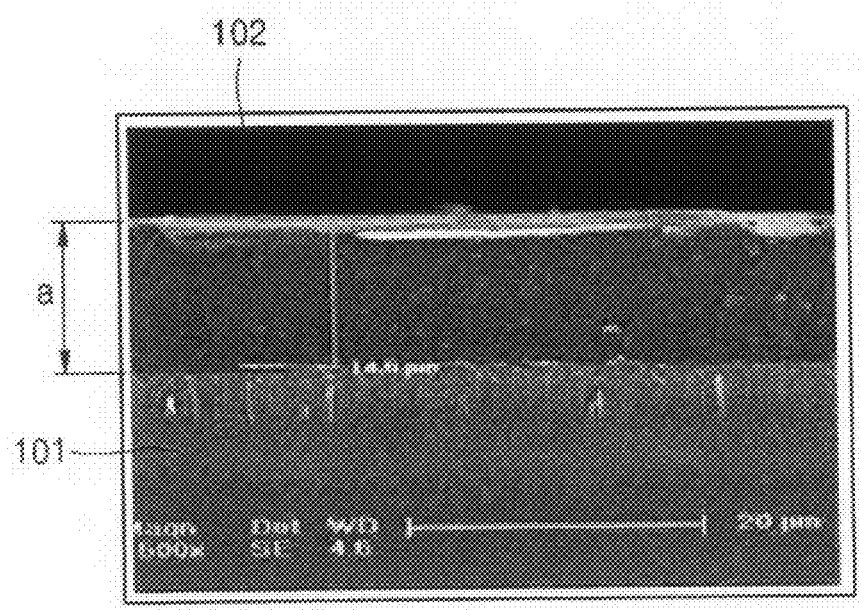

FIGS. 2 and 3 illustrate images showing sections of an OLED device according to an embodiment. More particularly, FIG. 2 illustrates a scanning electron microscope (SEM) image of a section of the outer portion of the OLED device. FIG. 3 illustrates a SEM image of a section of the center portion of the OLED device.

A filler 105 having a specific gravity of 1.08 and a viscosity of 320,000 cps was used in the OLED device illustrated in FIGS. 2 and 3. The volume of the filler 105 was approximately 140% of the volume of the space defined by the first substrate 101, the second substrate 102, and the inorganic sealing member (FIG. 1) without the filler 105. The bonding pressure, i.e., the vacuum, when the first substrate and the second substrate were bonded was 50 torr.

Referring to FIGS. 2 and 3, the thickness "b" of the outer portion of the OLED device, that is, the portion close to the inorganic sealing member, was approximately 7.8 μm. The thickness "a" of the center portion of the OLED device was approximately 14.7 μm. The thickness "a" of the center portion of the OLED device was approximately 87% greater than the thickness "b" of the outer portion of the OLED device.

Figure 4:
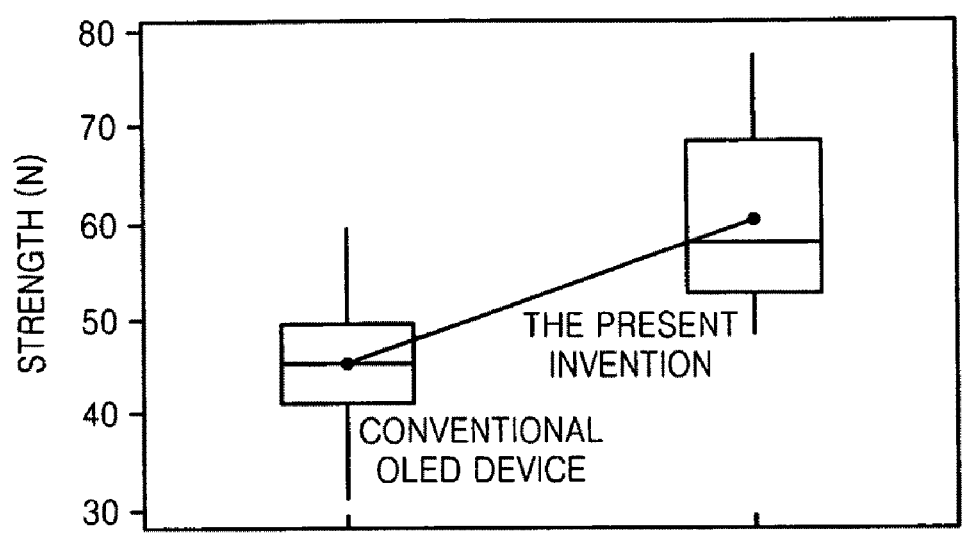
FIG. 4 illustrates a graph comparing bending strength of a conventional OLED device and an OLED device according to an embodiment.

FIG. 4 illustrates a graph showing results of a three-axis bending strength test on a conventional OLED device and the OLED device of FIGS. 2 and 3. In the three-axis bending strength test, two opposite ends of the OLED devices were fixed and pressure was applied to the center portion of the OLED devices. Referring to FIG. 4, the average bending strength of the OLED device according to an embodiment was approximately 60 N, whereas the average bending strength of the typical OLED device, which had a concave center portion, was approximately 45 N. Thus, the bending strength of the OLED device according to an embodiment was approximately 30% greater than that of the conventional OLED device.

Figure 5:
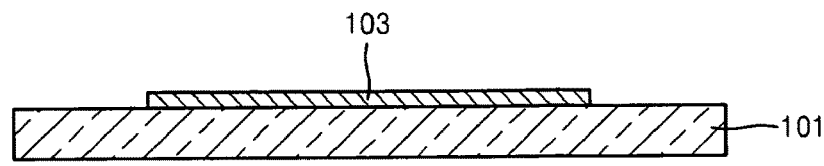
FIGS. 5 through 8 illustrate cross-sectional views of stages in a method of manufacturing an OLED device according to an embodiment.
Figure 6:

FIGS. 5 through 8 illustrate cross-sectional views of stages a method of manufacturing an OLED device according to an embodiment. First, as illustrated in FIG. 5, the organic emission unit 103 may be formed on a portion of the first substrate 101. Next, as illustrated in FIG. 6, the inorganic sealing member 104 may be formed on the second substrate 102. The inorganic sealing member 104 may include, e.g., frit. The inorganic sealing member 104 may be formed on outer portions of the second substrate 102. More particularly, the inorganic sealing member 104 may be formed on the outer portions of the second substrate 102 such that the organic emission unit 103 that is formed on the first substrate 101 is surrounded by the inorganic sealing member 104 when the first substrate 101 and the second substrate 102 are bonded to each other.

Figure 7:
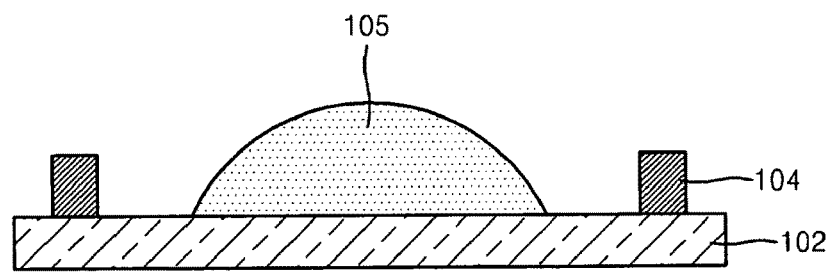

Next, as illustrated in FIG. 7, the filler 105 may be disposed on the second substrate 102. The filler 105 may be disposed on a portion of the second substrate 102 within, i.e., between portions of the inorganic sealing member 104. The filler 105 may be disposed on the second substrate 102 to be spaced apart from the inorganic sealing member 104 during manufacture. Since the filler 105 may be a material with high viscosity as described above, the filler 105 may be disposed convexly on the second substrate 102 without spreading due, e.g., to surface tension.

Figure 8:
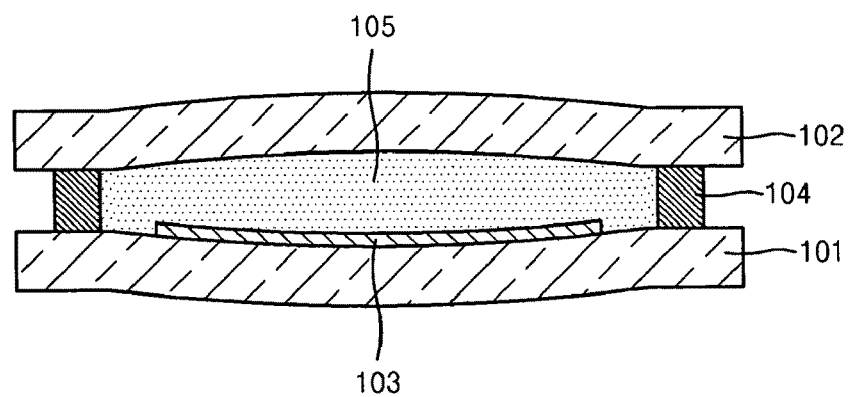

Next, as illustrated in FIG. 8, the first substrate 101 and the second substrate 102 may be bonded to each other. More particularly, the first substrate 101 and the second substrate 102 may be arranged such that a surface of the first substrate 101 having the organic emission unit 103 faces a surface of the second substrate 102 having the inorganic sealing member 104 and the filler 105. Then, the first substrate 101 and the second substrate 102 may be bonded to each other by, e.g., irradiating laser to the inorganic sealing member 104 in a vacuum. When the first substrate 101 and the second substrate 102 are bonded, the filler 105 may gradually move from the center portion of the second substrate 102 toward the outer portions of the second substrate 102 and may fill spaces between the first substrate 101 and the second substrate 102. In addition, a center portion of at least one of the first substrate 101 and the second substrate 102 may deform outwardly to increase the volume of the space therebetween to thereby accommodate the greater volume of filler 105 in the space. Thus, the thickness of the center portion of the OLED device 100 may become greater than the thicknesses of the outer portions of the OLED device 100.

According to the embodiments, shock that occurs if an OLED device is bent or dropped may be absorbed to advantageously minimize its effects on an organic emission unit in the OLED device, and thus, the shock-resistance of an OLED product may be improved.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:
1. An organic light emitting display (OLED) device, comprising:
   a first substrate having an organic emission unit on a surface thereof;
   a second substrate above the first substrate;
   an inorganic sealing member between the first substrate and the second substrate, the inorganic sealing member bonding the first substrate and the second substrate; and
   a filler, the filler having a viscosity of about 320,000 cps or greater and filling a space between the first substrate and the second substrate,
   wherein a volume of the filler is greater than a volume of a space between the first substrate, the second substrate, and the inorganic sealing member prior to bonding the first substrate and the second substrate.

2. The OLED device as claimed in claim 1, wherein the inorganic sealing member is formed of frit.

3. The OLED device as claimed in claim 1, wherein the inorganic sealing member is disposed at outer portions of the first substrate and the second substrate.

4. The OLED device as claimed in claim 1, wherein a thickness of a center portion of the OLED device is greater than thicknesses of outer portions of the OLED device.

5. The OLED device as claimed in claim 1, wherein an amount of the filler between center portions of the first substrate and the second substrate is greater than an amount between outer portions of the first substrate and the second substrate.

6. The OLED device as claimed in claim 5, wherein a thickness of the center portion of the OLED device is greater than thicknesses of outer portions of the OLED device.

7. The OLED device as claimed in claim 1, wherein the filler is a silicon-containing material.

8. A method of manufacturing an organic light emitting display (OLED) apparatus with a first substrate having an organic emission unit on a surface thereof and a second substrate above the first substrate, the method comprising:

forming the organic emission unit on the surface of the first substrate;

forming an inorganic sealing member on the second substrate;

disposing a filler having a viscosity of about 320,000 cps or greater on a portion of the second substrate; and bonding the first substrate and the second substrate such that a thickness of a center portion of the OLED device is greater than thicknesses of outer portions of the OLED device.

9. The method as claimed in claim 8, wherein the inorganic sealing member is formed of frit.

10. The method as claimed in claim 8, wherein the inorganic sealing member is disposed at outer portions of the second substrate such that the inorganic sealing member surrounds the organic emission unit of the bonded first substrate and second substrate.

11. The method as claimed in claim 8, wherein the step of disposing the filler on a portion of the second substrate is carried out such that the filler is disposed on a portion of the second substrate apart from the inorganic sealing member during manufacturing.

12. The method as claimed in claim 11, wherein the filler is disposed on a center portion of the second substrate.

13. The method as claimed in claim 12, wherein the bonding the first substrate and the second substrate includes:

arranging the first substrate and the second substrate such that the organic emission unit on the first substrate faces the filler on the second substrate;

arranging the first substrate and the second substrate on each other such that a portion of the filler flows from the center portion toward outer portions of the OLED device; and irradiating a laser on the inorganic sealing member to effect bonding of the first substrate and the second substrate.

14. The method as claimed in claim 8, wherein the bonding the first substrate and the second substrate is carried out in a vacuum.

* * * * *